United States Patent
Murata

(10) Patent No.: US 8,063,408 B2
(45) Date of Patent: Nov. 22, 2011

(54) INTEGRATED SEMICONDUCTOR OPTICAL DEVICE AND OPTICAL APPARATUS USING THE SAME

(75) Inventor: Michio Murata, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 92 days.

(21) Appl. No.: 12/607,521

(22) Filed: Oct. 28, 2009

(65) Prior Publication Data
US 2010/0117104 A1   May 13, 2010

(30) Foreign Application Priority Data

Nov. 11, 2008 (JP) ................................. 2008-288904

(51) Int. Cl.
*H01L 29/885* (2006.01)
*H01L 33/00* (2010.01)
(52) U.S. Cl. .................. 257/94; 257/106; 257/E29.341; 257/E33.027; 372/44.01
(58) Field of Classification Search .................... 257/94, 257/106, E29.341, E33.027; 372/44.01
See application file for complete search history.

(56) References Cited

U.S. PATENT DOCUMENTS
6,133,590 A   10/2000   Ashley et al.
2006/0205104 A1*  9/2006   Murata ........................... 438/42

FOREIGN PATENT DOCUMENTS
JP    64-28984      1/1989
JP    8-335745     12/1996
JP    2000-501238   2/2000

OTHER PUBLICATIONS

Nishiyama et al., "High efficiency long wavelength VCSEL on InP grown by MOCVD", Electronics Letters, Mar. 6, 2003, vol. 39, No. 5, pp. 437-439.
Ortsiefer et al., "Low-resistance InGa(Al)As Tunnel Junctions for Long Wavelength Vertical-cavity Surface-emitting Lasers", Jpn. J. Appl. Phys., vol. 39, (2000), pp. 1727-1729.

* cited by examiner

*Primary Examiner* — Hung Vu
*Assistant Examiner* — Vernon P Webb
(74) *Attorney, Agent, or Firm* — Smith, Gambrell & Russell, LLP

(57) ABSTRACT

In an integrated semiconductor optical device, a first cladding layer is made of a first conductivity type semiconductor. A first active layer for forming a first semiconductor optical device is provided on the first cladding layer in a first area of a principal surface of a substrate. A second active layer for forming a second semiconductor optical device is provided on the first cladding layer in a second area of the principal surface. A second cladding layer made of a second conductivity type semiconductor is provided on the second active layer. A third cladding layer made of a first conductivity type semiconductor is provided on the first active layer. A tunnel junction region is provided between the first active layer and the third cladding layer. The first active layer is coupled to the second active layer by butt joint. The second and third cladding layers form a p-n junction.

10 Claims, 8 Drawing Sheets

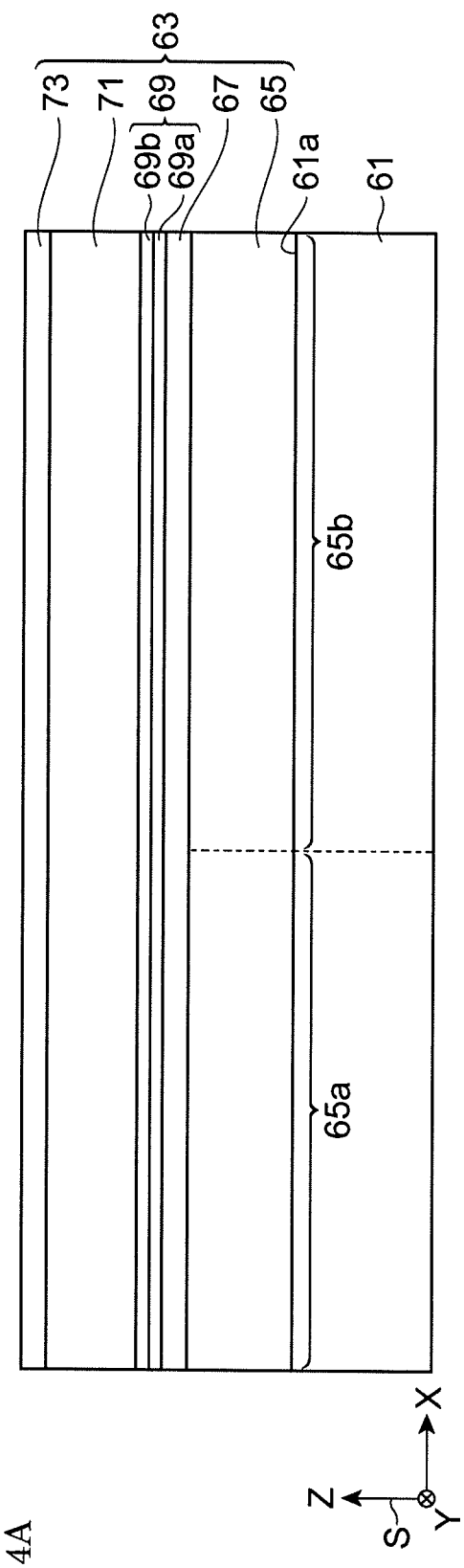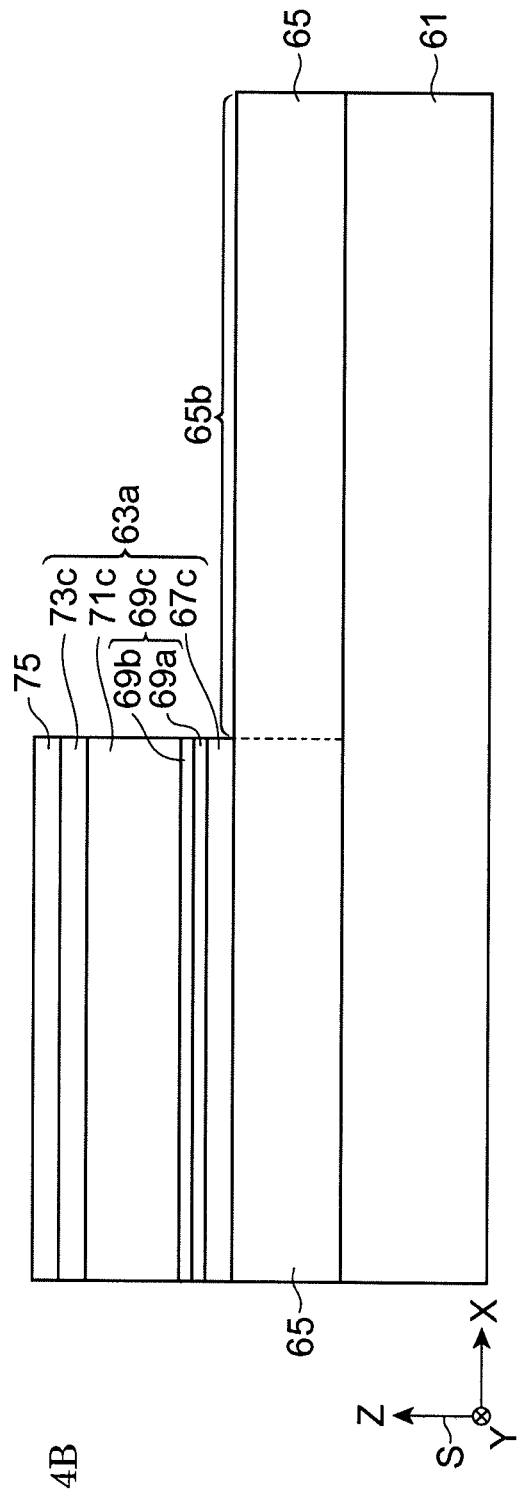
FIG. 4A
FIG. 4B

INTEGRATED SEMICONDUCTOR OPTICAL DEVICE AND OPTICAL APPARATUS USING THE SAME

BACKGROUND OF THE INVENTION

1. Field of the Invention

The present invention relates to an integrated semiconductor optical device and an optical apparatus using the same.

2. Description of the Related Art

Japanese Unexamined Patent Application Publication No. 64-28984 discloses an integrated semiconductor optical device. The integrated semiconductor optical device includes a distributed feedback laser diode (DFB laser diode), an optical modulator, and a connected portion provided between the DFB laser diode and the optical modulator. The connected portion is made of high-resistance semiconductor material.

Japanese Unexamined Patent Application Publication No. 8-335745 discloses a semiconductor light emitting device. The semiconductor light emitting device includes a distributed feedback laser diode portion (or DFB laser diode portion), an optical modulator portion, and an isolation portion provided between the DFB laser diode portion and the optical modulator portion. The method for manufacturing the semiconductor light emitting device includes the following steps. Firstly, an optical guiding layer made of n type InGaAsP is grown on n-type InP substrate. An active layer with multi quantum well (MQW) structure is grown on the DFB laser diode portion of the optical guiding layer, and an optical absorption layer with MQW structure is grown on the isolation portion and the optical modulator portion of the optical guiding layer. Then, a separate confinement heterostructure (SCH) layer made of p type InGaAsP, a cladding layer made of p type InP, and a contact layer made of p type InGaAsP are grown on the active layer and the optical absorption layer. Subsequently, any of Zn, Cu, proton and Fe is injected into the isolation portion between the DFB laser diode portion and the optical modulator portion to form a non-radiative recombination center that reaches an optical waveguide region. In this process, disordering occurs in the MQW structure of the optical absorption layer of the isolation portion. Consequently, band of absorption wavelength is shifted toward a shorter wavelength and absorption of laser beam is reduced, accordingly.

Japanese Unexamined Patent Application Publication No. 2000-501238 discloses a low resistance contact semiconductor diode. In the semiconductor laser, a layer of heavily doped p-type semiconductor material is replaced by a layer of heavily doped n-type semiconductor material and a thin layer of heavily doped p-type semiconductor material. This structure facilitates low resistance contact.

Elec. Lett. 39(2003) Vol. 39 No. 5 pp. 437, Electron Letters Online No. 20030288 discloses a vertical-cavity surface emitting-layer (VCSEL) using AlGaInAs/AlGaInAs tunnel junction.

Jpn. J. Appl. Phys Vol. 39 (2000) pp. 1727-1729 discloses a vertical-cavity surface emitting-layer (VCSEL) using $p^+InGa(Al)As/n^+InGa(Al)As$ tunnel junction.

In an integrated semiconductor optical device including a plurality of semiconductor optical devices formed on a substrate, one semiconductor optical device and another semiconductor optical device are coupled optically to each other. These semiconductor optical devices are separated electrically from each other. These semiconductor optical devices are formed by layering an n-type cladding layer, an active layer and a p-type cladding layer in this order on the semiconductor substrate. The active layer is located between the n-type cladding layer and the p-type cladding layer and has a pin structure. When the active layer is forward biased, the semiconductor optical device operates as a light emitting device. When the active layer is reverse biased, the semiconductor optical device operates as an optical photodiode or an optical modulation device.

The integrated device described in Japanese Unexamined Patent Application Publications No. 64-28984 and No. 8-335745 includes two types of semiconductor optical device, that is, a semiconductor laser and an optical modulation device. A semiconductor layer stack for forming the semiconductor laser, and a semiconductor layer stack for forming the optical modulation device are formed on an n-type semiconductor substrate. The semiconductor layer stack in the semiconductor laser region includes an active layer and a p-type semiconductor layer. The semiconductor layer stack in the optical modulation device region also includes another active layer and another p-type semiconductor layer. A p-side electrode is formed on the p-type semiconductor layer of the semiconductor laser region. Similarly, another p-side electrode is formed on the p-type semiconductor layer of the optical modulation device region. On the other hand, a common n-side electrode is formed on the other side of the n-type semiconductor substrate. The p-side electrodes formed in the semiconductor laser region and the optical modulation device region are insulated electrically from each other.

As a structure for electrical isolation of the two semiconductor optical devices, Japanese Unexamined Patent Application Publication No. 64-28984 discloses an isolation region in which a high-resistance semiconductor is buried and grown. In the isolation region, discontinuity is formed in the waveguide structure during the processes of etching, burying and growing. This discontinuity causes optical scattering loss. In forming the isolation region, the number of processes of crystal growth increases, so that the processes are complicated.

As a structure for electrical isolation of the two semiconductor optical devices, Japanese Unexamined Patent Application Publication No. 8-335745 discloses an isolation region which is different from that of Japanese Unexamined Patent Application Publication No. 64-28984. In the isolation region, a p-type carrier is inactivated. Therefore, value of resistance of the relevant part is high. The inactivation of the carrier is performed by forming crystal defect by implanting proton and/or iron ion into part of a p-type clad. However, since the ion implantation leads defect into the semiconducting crystal, it has been found out that when the isolation region is formed using the ion implantation, reliability of device deteriorates.

Elec. Lett. 39(2003) Vol. 39 No. 5 pp. 437, Electron Letters Online No. 20030288 and Jpn. J. Appl. Phys Vol. 39 (2000) pp. 1727-1729 disclose a VCSEL, which includes a tunnel junction for confining a current into the active region.

SUMMARY OF THE INVENTION

Accordingly, it is an object of the invention to provide an integrated semiconductor optical device that electrically isolates two semiconductor optical devices manufactured on a single substrate, and an optical apparatus including such integrated semiconductor optical device.

An aspect of the present invention is an integrated semiconductor optical device including a first semiconductor optical device and a second semiconductor optical device. The integrated semiconductor optical device includes (a) a substrate having a principal surface having a first area for forming the first semiconductor optical device and a second area for forming the second semiconductor optical device, (b) a first cladding layer provided on the principal surface of the substrate and made of a first conductivity type semiconductor, (c) a first active layer provided on the first cladding layer in the first area of the principal surface of the substrate, (d) a second active layer provided on the first cladding layer in the second area of the principal surface of the substrate, (e) a second cladding layer provided on the second active layer and made of a second conductivity type semiconductor, (f) a third cladding layer provided on the first active layer and made of a first conductivity type semiconductor, and (g) a tunnel junction region provided between the first active layer and the third cladding layer. The first active layer is coupled to the second active layer by butt joint. The second cladding layer and the third cladding layer form a p-n junction. The tunnel junction region includes a first conductivity type semiconductor layer, a second conductivity type semiconductor layer and a tunnel junction that is located between the first conductivity type semiconductor layer and the second conductivity type semiconductor layer.

According to the above integrated semiconductor optical device, carrier is converted from one of electron and hole to the other by the tunnel junction region provided between the first active layer and the third cladding layer. Therefore, although the conductivity type of the first cladding layer is the same as that of the third cladding layer, both electron and hole are injectable into the first active layer. On the other hand, when the second active layer between the second cladding layer and the first cladding layer is reverse biased, the p-n junction between the second cladding layer and the third cladding layer is reverse biased. Thus, the first and second semiconductor optical devices are separated electrically from each other even though the first and second semiconductor optical devices are physically contacted.

The integrated semiconductor optical device according to the aspect of the present invention may further include a semiconductor mesa provided on the principal surface of the substrate and extending in a direction of a predetermined axis, and a buried layer provided on the principal surface of the substrate and a side surface of the semiconductor mesa, the buried layer may include a semi-insulating semiconductor region, the semiconductor mesa may include the first active layer and the second active layer, the buried layer may be provided on a side surface of the first active layer, the buried layer may be provided on a side surface of the second active layer, and the predetermined axis may extend across a boundary between the first area and the second area.

According to the above integrated semiconductor optical device, the buried layer made of the semi-insulating material is provided on the principal surface of the substrate and the side surface of the semiconductor mesa. Therefore, voltage between the first cladding layer and the third cladding layer is applied effectively to the first active layer of the semiconductor mesa. Therefore, current is effectively confined in the first active layer in the semiconductor mesa covered with the buried layer made of the semi-insulating material. Voltage between the first cladding layer and the second cladding layer is also applied effectively to the second active layer of the semiconductor mesa.

In the integrated semiconductor optical device of the present invention, the second cladding layer and the third cladding layer may be arranged along the direction of the predetermined axis and in contact at a boundary with each other, and the p-n junction may be formed at the boundary.

In the integrated semiconductor optical device according to the aspect of the present invention, the first active layer may form an active layer of a semiconductor light emitting device, the second layer may form an active layer of a semiconductor optical modulation device, and band gap energy of the first active layer may be smaller than that of the second active layer.

According to the above integrated semiconductor optical device, the buried layer made of the semi-insulating material serves to confine electric current that flows through the integrated semiconductor optical device to the semiconductor mesa. The semiconductor optical modulation device modulates light emitted from the semiconductor light emitting device. The p-n junction located between the second cladding layer and the third cladding layer is reverse biased. Thus, the semiconductor optical modulation device and the semiconductor light emitting device are separated electrically from each other even though the semiconductor optical modulation device and the semiconductor light emitting device are physically contacted.

In the integrated semiconductor optical device according to the aspect of the present invention, the tunnel junction region may be formed on the first active layer, the first conductivity type semiconductor layer may exhibit an n-type conductivity, and the second conductivity type semiconductor layer may exhibit a p-type conductivity.

According to the above integrated semiconductor optical device, while electron is injected from the first cladding layer to the first active layer, hole is injected from the tunnel junction region to the first active layer.

In the integrated semiconductor optical device according to the aspect of the present invention, the second conductivity type semiconductor layer may include a carbon-doped AlGaInAs layer.

According to the above integrated semiconductor optical device, when carbon is used as a p-type dopant, diffusion of p-type dopant from the tunnel junction region to the active layer is reduced. This is because carbon has smaller diffusion coefficient than zinc that is commonly used as a p-type dopant. In addition, since carbon is doped to AlGaInAs at heavy doping concentration, an excellent tunnel junction is formed.

In the integrated semiconductor optical device according to the aspect of the present invention, the first conductivity type semiconductor layer may include an n-type GaInAsP layer, and band gap energy of the GaInAsP layer may be larger than that of the first active layer.

According to the above integrated semiconductor optical device, the first conductivity type semiconductor layer is composed of a GaInAsP layer, so that band gap energy of the n-type region of the tunnel junction region is reduced. In addition, light which propagates through the first active layer is prevented from being absorbed by the first conductivity type semiconductor layer of the tunnel junction region.

In the integrated semiconductor optical device according to the aspect of the present invention, the second conductivity type semiconductor layer may be provided between the first conductivity type semiconductor layer and the first active layer, and band gap energy of the second conductivity type semiconductor layer may be larger than that of the first conductivity type semiconductor layer.

According to the above integrated semiconductor optical device, material of the second conductivity type semiconductor layer has larger band gap energy than that of the first conductivity type semiconductor layer, so that hole is efficiently injected.

The integrated semiconductor optical device according to the aspect of the present invention may further include a first contact layer provided on the third cladding layer and made of a first conductivity type semiconductor, and a second contact layer provided on the second cladding layer and made of a second conductivity type semiconductor, and edge of the first contact layer may be physically separated from that of the second contact layer.

According to the above integrated semiconductor optical device, edge of the first contact layer is physically separated from that of the second contact layer, so that the first contact layer does not form a p-n junction together with the second contact layer.

In the integrated semiconductor optical device according to the aspect of the present invention, the first contact layer and the second contact layer may not cover the p-n junction.

According to the above integrated semiconductor optical device, neither the first contact layer is joined to the second cladding layer nor the second contact layer is joined to the third cladding layer.

Another aspect of the invention provides an optical apparatus. The optical apparatus includes (a) the above-described integrated semiconductor optical device, (b) a first power supply for applying forward bias to the integrated semiconductor optical device, and (c) a second power supply for applying reverse bias to the integrated semiconductor optical device. The integrated semiconductor optical device includes a first electrode provided on the third cladding layer, a second electrode provided on the second cladding layer, and a third electrode provided on a secondary surface of the substrate. The first power supply is connected in between the first electrode and the third electrode. The second power supply is connected in between the second electrode and the third electrode.

The above-described object, further objects, features and advantages of the present invention become apparent more easily from the following detailed description of the preferred embodiment of the present invention given by referring to the accompanying drawings.

BRIEF DESCRIPTION OF THE DRAWINGS

FIGS. 4A and 4B each are a process drawing showing a principal process in a method for manufacturing the integrated semiconductor optical device according to the embodiment;

DESCRIPTION OF THE PREFERRED EMBODIMENTS

Figure 1:
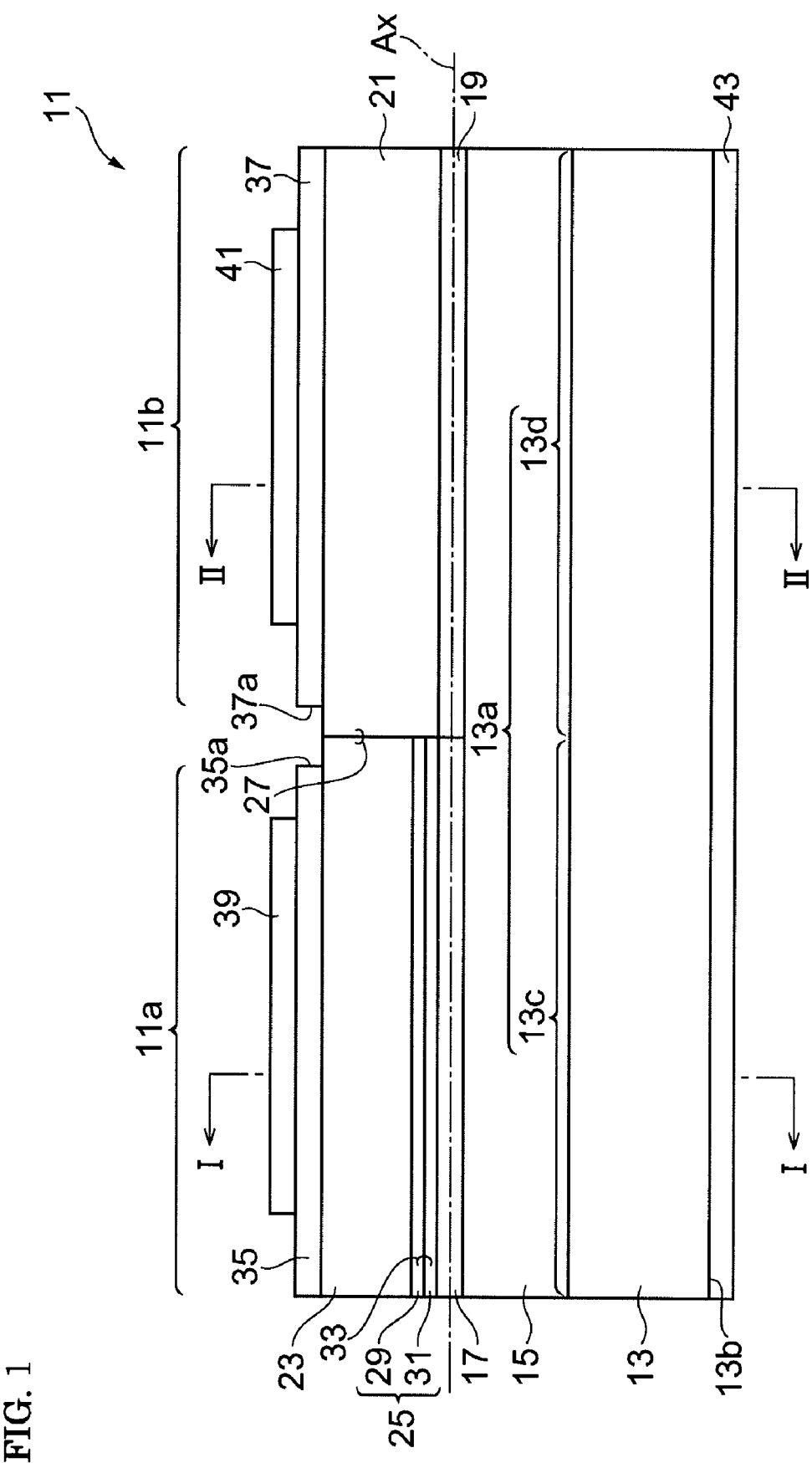
FIG. 1 is a schematic view showing an integrated semiconductor optical device according to an embodiment.

Findings of the present invention are easily understood by considering the following detailed description with reference to the accompanying drawings taken as an example. An embodiment of the integrated semiconductor optical device and the semiconductor optical apparatus according to the present invention will now be described with reference to the accompanying drawings. If available, the same reference numerals or signs are applied to the same elements.

FIG. 1 is a schematic view showing an integrated semiconductor optical device according to the present embodiment. The integrated semiconductor optical device 11 includes a first semiconductor optical device 11a and a second semiconductor optical device 11b. The integrated semiconductor optical device 11 includes a substrate 13, a first cladding layer 15, a first active layer 17, a second active layer 19, a second cladding layer 21, a third cladding layer 23 and a tunnel junction region 25. The substrate 13 has on the opposite sides thereof a principal surface 13a and a secondary surface 13b. The principal surface 13a includes a first area 13c for forming the first semiconductor optical device 11a and a second area 13d for forming the second semiconductor optical device 11b. The substrate 13 is, for example, a semiconductor substrate. For example, III-V group compound semiconductor substrate such as InP substrate is used.

The first cladding layer 15 is made of a first conductivity type semiconductor and located on the principal surface 13a of the substrate 13. The first active layer 17 is located on the first cladding layer 15 in the first area 13c of the principal surface 13a. The second active layer 19 is located on the first cladding layer 15 in the second area 13d of the principal surface 13a. The first active layer 17 is coupled optically to the second active layer 19 by butt-joint. The second cladding layer 21 is located on the second active layer 19 and made of a second conductivity type semiconductor. The third cladding layer 23 is located on the first active layer 17 and made of a first conductivity type semiconductor. The tunnel junction region 25 is provided between the first active layer 17 and the third cladding layer 23. The second cladding layer 21 and the third cladding layer 23 are located in contact with each other and form at the boundary therebetween a p-n junction. The tunnel junction region 25 includes a first conductivity type semiconductor layer 29, a second conductivity type semiconductor layer 31 and a tunnel junction 33. The tunnel junction 33 is composed of the first conductivity type semiconductor layer 29 and the second conductivity type semiconductor layer 31.

In the integrated semiconductor optical device 11, the first semiconductor optical device 11a including the first active layer 17 is, for example, a light emitting device. When the light emitting device is forward biased, both carriers of electron and hole are injected into the active layer 17 thereby emitting light from the active layer 17. On the other hand, the second semiconductor optical device 11b including the second active layer 19 is, for example, an optical modulation device. The optical modulation device is reverse biased during operation and modulating signal is applied to the active layer 19. The light emitted from the first semiconductor optical device 11a is coupled optically to the second semiconductor optical device 11b, modulated by the modulating signal, and emitted out of the second semiconductor optical device 11b. As an example of the optical modulation device, an Electro-Absorption (EA) modulator having a quantum well active layer is used.

According to the integrated semiconductor optical device 11, carrier is converted from one of electron and hole to the other by the tunnel junction region 25 provided between the first active layer 17 and the third cladding layer 23. Therefore, although the conductivity type of the first cladding layer 15 is same as that of the third cladding layer 23, both electron and hole are injectable into the first active layer 17. On the other hand, when the second active layer 19 between the second cladding layer 21 and the first cladding layer 15 is reverse biased, the p-n junction 27 composed of the second cladding layer 21 and the third cladding layer 23 is reverse biased. Thus, the first and second semiconductor optical devices 11a and 11b are separated electrically from each other.

The integrated semiconductor optical device 11 further includes a first contact layer 35 and a second contact layer 37. The first contact layer 35 is located on the third cladding layer 23 and the second contact layer 37 is located on the second cladding layer 21. The first contact layer 35 is made of a first conductivity type semiconductor and the second contact layer 37 is made of a second conductivity type semiconductor.

In the present embodiment, the first contact layer 35 is separated physically from the second contact layer 37 as shown in FIG. 1. Dopant concentration of the first contact layer 35 is higher than that of the third cladding layer 23, and dopant concentration of the second contact layer 37 is higher than that of the second cladding layer 21. The conductivity type of the first contact layer 35 is opposite to that of the second contact layer 37. Since the edge 35a of the first contact layer 35 is separated physically from the edge 37a of the second contact layer 37, the first and second contact layers 35, 37 do not form a p-n junction. Thus, it is possible to avoid the p-n junction formed by the contact between a p-type semiconductor layer with a high doping concentration and a n-type semiconductor layer with a high doping concentration.

The p-n junction 27 is not covered with the first and second contact layers 35, 37. According to the integrated semiconductor optical device 11, neither the first contact layer 35 is joined to the second cladding layer 21 nor the second contact layer 37 is joined to the third cladding layer 23.

The integrated semiconductor optical device 11 further includes a first electrode 39 located on the third cladding layer 23, a second electrode 41 located on the second cladding layer 21, and a third electrode 43 located on the secondary surface 13b of the substrate 13. The first electrode 39 is in contact with the contact layer 35 via opening of the insulator film that covers the contact layer 35. The second electrode 41 is in contact with the contact layer 37 via opening of the insulator film that covers the contact layer 37. The first electrode 39 is separated physically from the second electrode 41.

Figure 2A:
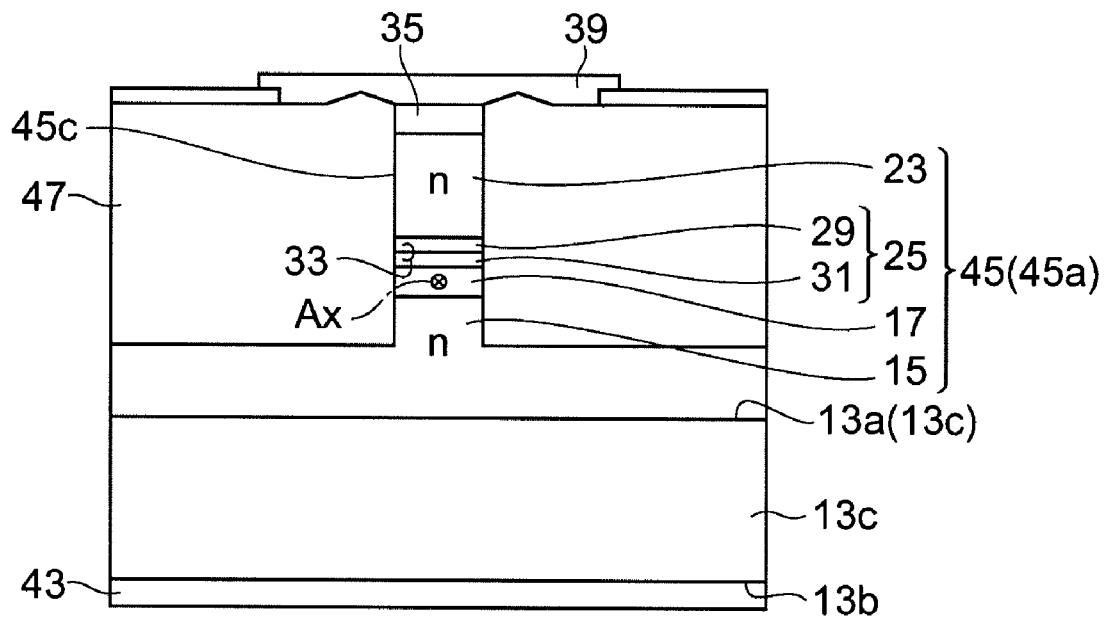
FIG. 2A is a cross sectional view as taken along the line I-I of the integrated semiconductor optical device of FIG. 1
Figure 2B:
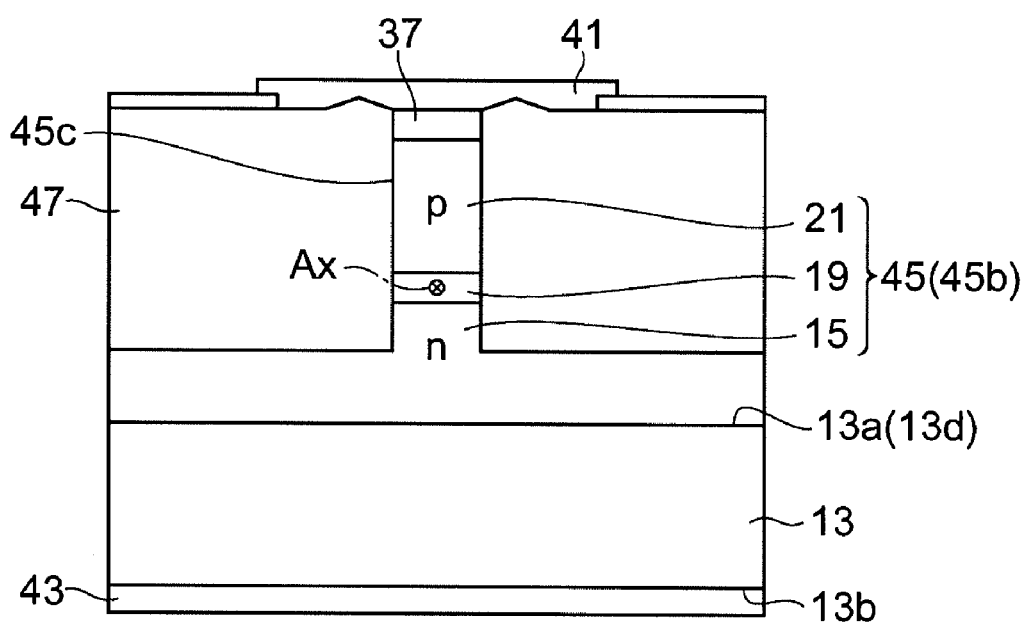
FIG. 2B is a cross sectional view as taken along the line II-II of the integrated semiconductor optical device of FIG. 1.

FIG. 2A is a cross sectional view as taken along the line I-I of the integrated semiconductor optical device of FIG. 1. FIG. 2B is a cross sectional view as taken along the line II-II of the integrated semiconductor optical device of FIG. 1.

The integrated semiconductor optical device 11 further includes a semiconductor mesa 45 and a buried layer 47. The semiconductor mesa 45 is located on the principal surface 13a of the substrate 13 and extends in the direction of a predetermined axis Ax. The predetermined axis Ax extends across the boundary between the first area 13c and the second area 13d. The semiconductor mesa 45 includes the first active layer 17 and the second active layer 19. The semiconductor mesa 45 includes a first mesa portion 45a which forms part of the first semiconductor optical device 11a, and a second mesa portion 45b which forms part of the second semiconductor optical device 11b. The first mesa portion 45a includes the first cladding layer (for example, n-type layer) 15, the first active layer 17, the tunnel junction region (for example, n+/p+ junction) 25, the third cladding layer (for example, n-type layer) 23 and the first contact layer (for example, n-type layer) 35. The second mesa portion 45b includes the first cladding layer (for example, n-type layer) 15, the second active layer 19, the second cladding layer (for example, p-type layer) 21 and the second contact layer (for example, p-type layer) 37.

The buried layer 47 is located on the principal surface 13a of the substrate 13 and the side surface 45c of the semiconductor mesa 45. The buried layer 47 is located on the side surfaces of the first mesa portion 45a and the first active layer 17. In addition, the buried layer 47 is located on the side surfaces of the second mesa portion 45b and the second active layer 19. The buried layer 47 may include a semi-insulating semiconductor region. In this case, the semi-insulating semiconductor region is provided on the principal surface 13a of the substrate 13 and the side surface 45a of the semiconductor mesa 45. The semi-insulating semiconductor region is made of semi-insulating InP doped with Fe or Ru as a dopant.

According to the integrated semiconductor optical device 11, current is intensively confined in the first active layer 17 in the first mesa portion 45a because the semi-insulating semiconductor region is provided on the principal surface 13a of the substrate 13 and the side surface 45c of the semiconductor mesa 45. On the other hand, reverse biased voltage is applied effectively to the second active layer 19 in the second mesa portion 45b because the semi-insulating semiconductor region is provided on the principal surface 13a of the substrate 13 and the side surface 45c of the semiconductor mesa 45. Capacitance between the second electrode 41 and the substrate 13 can be reduced by using the mesa structure buried with the semi-insulating semiconductor region.

In an example of the integrated semiconductor optical device 11, the first active layer 17 is provided as an active layer of semiconductor light emitting device and the second active layer 19 is provided as an active layer of semiconductor optical modulation device. The photoluminescence (PL) wavelength of the first active layer 17 is larger than that of the second active layer 19. That is, band gap of the first active layer 17 is smaller than that of the second active layer 19. When modulating signal has not been applied to the semiconductor optical modulation device, light emitted from the first active layer 17 is not absorbed in the second active layer 19 but is emitted out of the second active layer 19. On the other hand, when modulating signal has been applied to the semiconductor optical modulation device, light absorption of the second active layer 19 is changed in accordance with the modulating signal. Consequently, modulated light is emitted out of the integrated semiconductor optical device 11.

Forward bias is applied between the first electrode 39 and the third electrode 43. Reverse bias is applied between the second electrode 41 and the third electrode 43. The first electrode 39 is in contact with the first contact layer 35. The second electrode 41 is in contact with the second contact layer 39.

According to the integrated semiconductor optical device 11, the semiconductor light emitting device is forward biased to emit the optical light at the predetermined wavelength. On the other hand, the semiconductor optical modulation device is reverse biased to modulate light emitted from the semiconductor light emitting device. The second cladding layer 21 and the third cladding layer 23 both of which are arranged along the predetermined axis Ax are located in contact with each other and form at the boundary thereof a p-n junction 27. The p-n junction 27 composed of the second cladding layer 21 and the third cladding layer 23 is reverse biased. Therefore, the semiconductor optical modulation device and the semiconductor light emitting device are separated electrically from each other.

The following will describe an example of the configuration of the integrated semiconductor optical device 11. This device 11 includes a semiconductor laser and an EA modulator both of which are provided on the substrate.
Substrate 13: n-type InP substrate
First cladding layer 15: Si doped n-type InP
Tunnel junction region 25: heavily Si-doped n-type GaInAsP/heavily C-doped p-type AlGaInAs
First active layer 17: undoped GaInAsP
Second active layer 19: undoped GaInAsP
Second cladding layer 21: Zn doped p-type InP
Third cladding layer 23: Si doped n-type InP
First contact layer 35: Si doped n-type GaInAs
Second contact layer 37: Zn doped p-type GaInAs
Buried layer 47: Fe doped semi-insulating InP In the integrated semiconductor optical device 11, the tunnel junction region 25 is formed on the first active layer 17. The tunnel junction region 25 includes the first conductivity type semiconductor layer 29 and the second conductivity type semiconductor layer 31. The first conductivity type semiconductor layer 29 exhibits n-type conductivity and the second conductivity type semiconductor layer 31 exhibits p-type conductivity. The second conductivity type semiconductor layer 31 is located between the first conductivity type semiconductor layer 29 and the first active layer 17. While electron is injected from the first cladding layer 15 to the first active layer 17, hole is injected from the tunnel junction region 25 to the first active layer 17. Band gap of the second conductivity type semiconductor layer 31 is preferably larger than that of the first conductivity type semiconductor layer 29.

In the tunnel junction region 25, the second conductivity type semiconductor layer 31 is composed of an AlGaInAn layer, to which carbon is doped as a p-type impurity. Zinc (Zn) impurity may be usually used as a p-type impurity. However, the diffusion coefficient of zinc is larger than that of carbon. This is the reason why carbon is used as a p-type impurity. When carbon is used as a p-type impurity, diffusion of the p-type dopant from the tunnel junction region 25 to the first active layer 17 can be reduced. In addition, carbon can be doped at heavy doping concentration into AlGaInAs. Therefore, carbon is preferable to form a tunnel junction when the second conductivity type semiconductor layer 31 is composed of an AlGaInAn layer.

Figure 3:
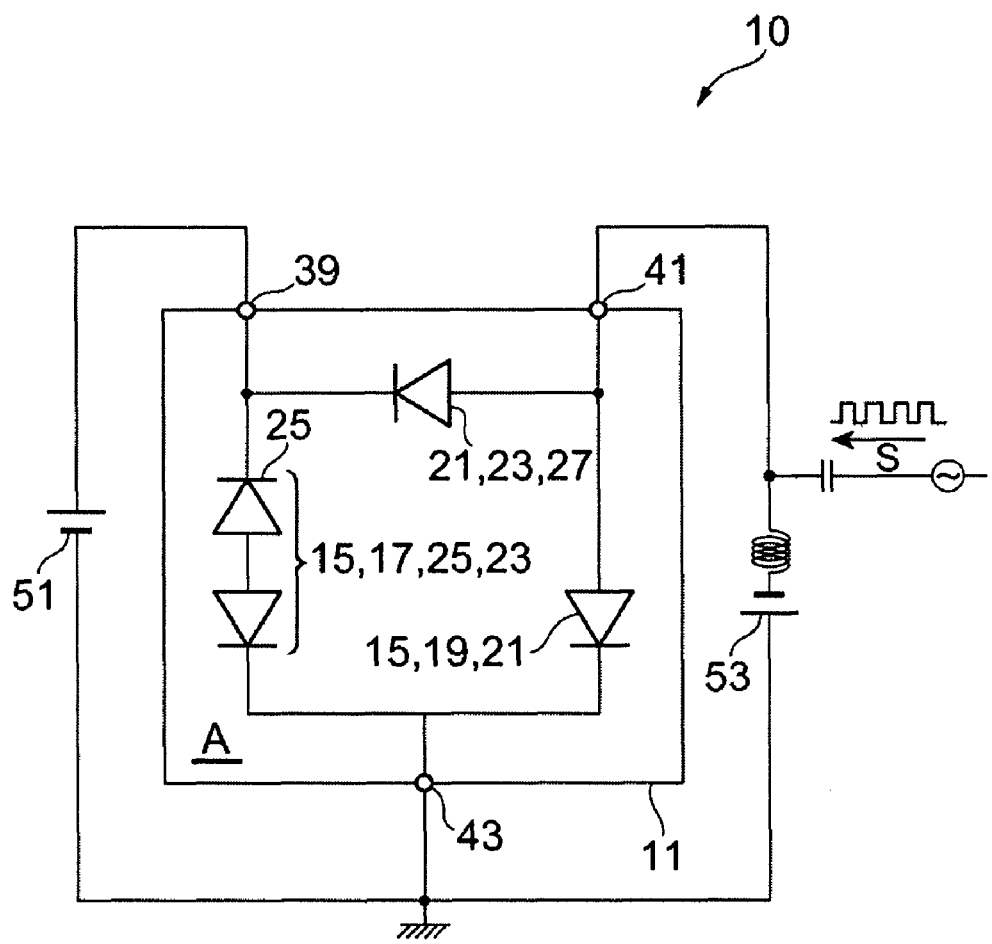
FIG. 3 is a circuit diagram showing an equivalent circuit A of an optical apparatus including the integrated semiconductor optical device according to the embodiment.

In the tunnel junction region 25, the first conductivity type semiconductor layer 29 and the second conductivity type semiconductor layer 31 are composed of a GaInAsP layer and a AlGaInAs layer, respectively. Band gap energy of AlGaInAs for the second conductivity type semiconductor layer 31 is set to be larger than that of GaInAsP for the first conductivity type semiconductor layer 29. Thus, hole is efficiently injected in the tunnel junction region 25. In addition, composition of the GaInAsP layer is determined so that band gap wavelength of the GaInAsP layer is shorter than the wavelength of light which propagates through the first active layer 17. The absorption of light at the n-type GaInAsP layer of the tunnel junction region 25 is reduced. It is noted that the band gap wavelength $\lambda g$ exhibits emission wavelength due to interband transition determined by band gap Eg of semiconductor. The band gap wavelength $\lambda g$ and the band gap Eg have the following relation. $\lambda g=1.24/Eg$ FIG. 3 is a schematic view showing an equivalent circuit A of an optical apparatus including the integrated semiconductor optical device according to the present embodiment. The optical apparatus 10 includes the above-described integrated semiconductor optical device 11, a first power supply 51 and a second power supply 53. The first power supply 51 is a direct-current power supply for applying forward bias to the first semiconductor optical device 11a of the integrated semiconductor optical device 11. Also, the second power supply 53 is a direct-current power supply for applying reverse bias to the second semiconductor optical device 11b of the integrated semiconductor optical device 11. The first power supply 51 is connected in between the first electrode 39 and the third electrode 43. The second power supply 53 is connected in between the second electrode 41 and the third electrode 43. For example, superimposed signal of high-frequency modulating signal S may be applied to the second power supply 53.

The following will describe the method of manufacturing the integrated semiconductor optical device according to the present embodiment with reference FIGS. 4A through 7C, in which rectangular coordinate systems S are shown. As shown in FIG. 4A, the semiconductor lamination 63 which contains an active layer 67 and tunnel junction region 69 is grown. In the following manufacturing method, metal-organic vapor phase epitaxy (MOVPE) method is used for crystal growth. An n-type InP substrate 61 is provided. Specifically, a Si-doped InP lower cladding layer 65, a GaInAsP active layer 67, a tunnel junction region 69, a Si-doped InP upper cladding layer 71 and a Si-doped GaInAs contact layer 73 are grown in this order on the principal surface 61a of the n-type InP substrate 61. The lower cladding layer 65 includes a first semiconductor region 65a for forming a semiconductor laser portion and a second semiconductor region 65b for forming an optical modulator portion. The tunnel junction region 69 includes a C-doped AlGaInAs region 69a and a Si-doped GaInAsP region 69b.

As shown in FIG. 4B, a part of the surface of the semiconductor lamination 63 for forming the semiconductor laser portion is covered with a mask 75. The mask 75 is formed by dielectric film such as silicon oxide ($SiO_2$) or silicon nitride (SiN). By etching the semiconductor lamination 63 with the mask 75, the semiconductor lamination 63a is formed and the second semiconductor region 65b is exposed for forming the optical modulator portion. The semiconductor lamination 63a includes the Si-doped InP lower cladding layer 65, an active layer 67c, a tunnel junction region 69c, a Si-doped InP upper cladding layer 71c and a Si-doped GaInAs contact layer 73c.

Figure 5:
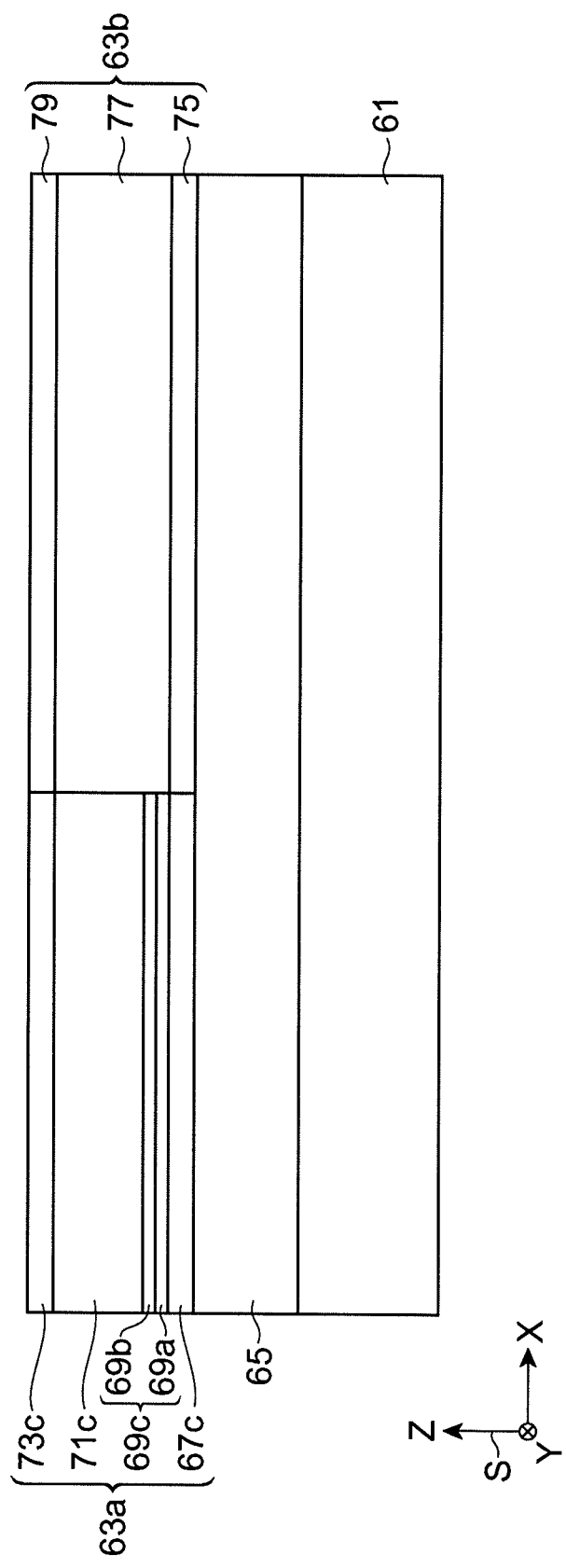
FIG. 5 is a process drawing showing a principal process in a method for manufacturing the integrated semiconductor optical device according to the embodiment, which follows FIG. 4B.

The semiconductor lamination 63 is etched until the lower cladding layer 65 is exposed by dry etching method. Then, the semiconductor lamination 63b is grown for forming the optical modulator portion as shown in FIG. 5. Specifically, a GaInAsP active layer 75 which is a light-absorbing layer of the optical modulator portion, a Zn-doped InP cladding layer 77 and a Zn-doped contact layer 79 are grown. The active layer 67c and the active layer 75 are coupled optically to each other by butt-joint.

Figure 6A:
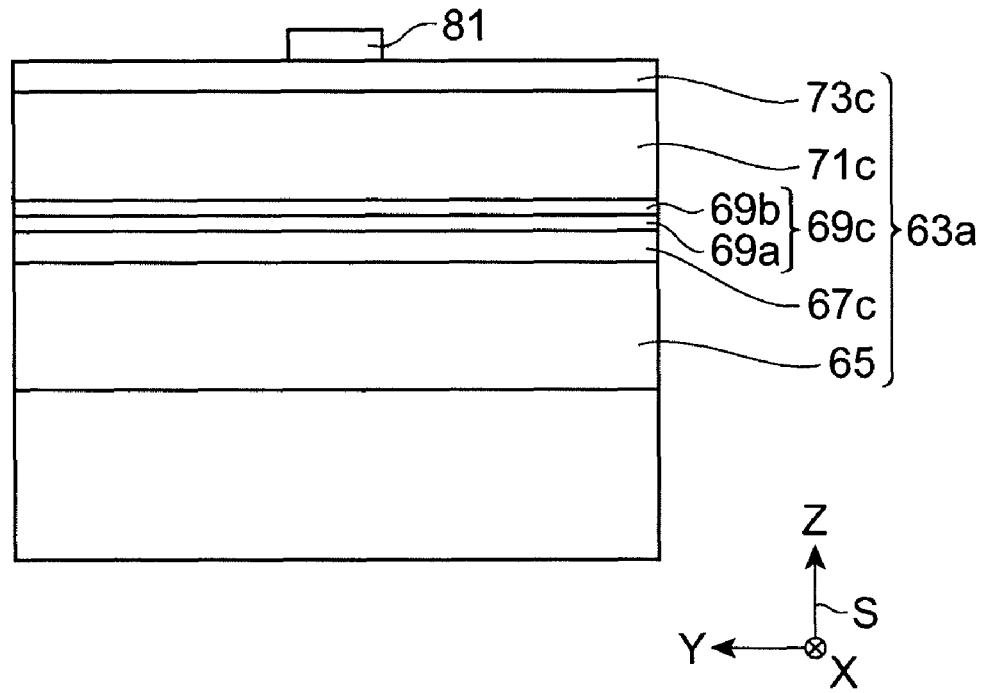
FIGS. 6A and 6B each are a process drawing showing a principal process in a method for manufacturing the integrated semiconductor optical device according to the embodiment, which follow FIG. 5.
Figure 6B:
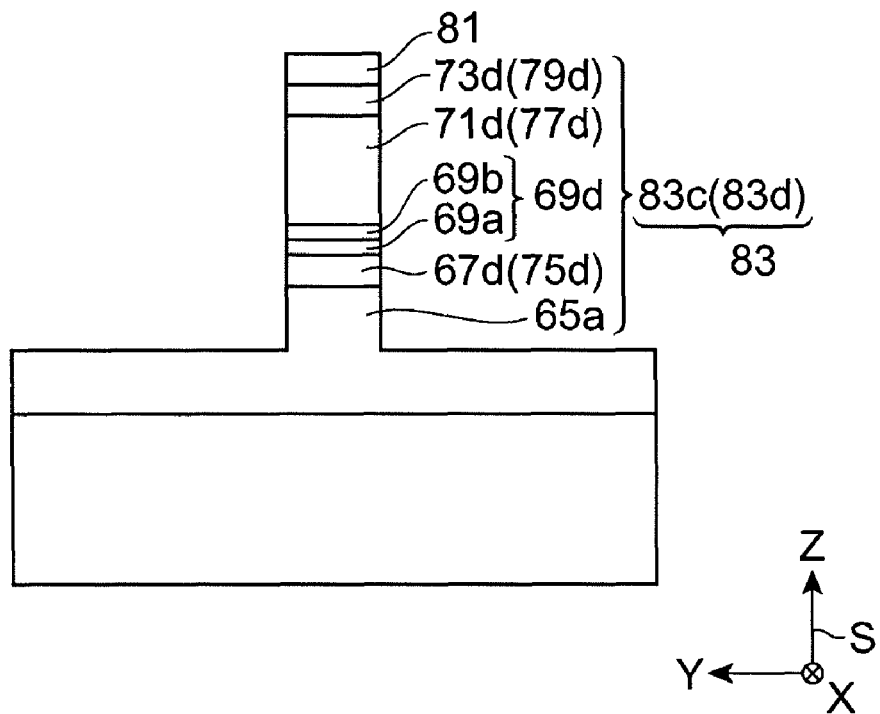

FIGS. 6A through 7C each show a cross sectional view of the semiconductor laser portion of the integrated semiconductor optical device. Although the optical modulator portion is different from the semiconductor laser portion in the active layer and a semiconductor layer on the active layer, the optical modulator portion is fabricated as in the case of the semiconductor laser portion by the following processes. As shown in FIG. 6A, a striped insulator mask 81 is manufactured on the semiconductor laminations 63a and 63b. The insulator mask 81 has, for example, a width of 1.5 micrometer and formed from silicon oxide ($SiO_2$) film or silicon nitride (SiN) film, for example. Subsequently, as shown in FIG. 6B, by etching the semiconductor laminations 63a and 63b with the insulator mask 81, a semiconductor mesa 83 is formed. This etching is performed so as to reach the lower cladding layer 65. The semiconductor mesa 83 includes a first mesa portion 83c for forming the semiconductor laser portion and a second mesa portion 83d for forming the optical modulator portion. The first mesa portion 83c includes the lower cladding layer 65a, an active layer 67d, a tunnel junction region 69d, an upper cladding layer 71d and a contact layer 73d. The second mesa portion 83d includes the lower cladding layer 65a, an active layer 75d, an upper cladding layer 77d and a contact layer 79d.

Figure 7A:
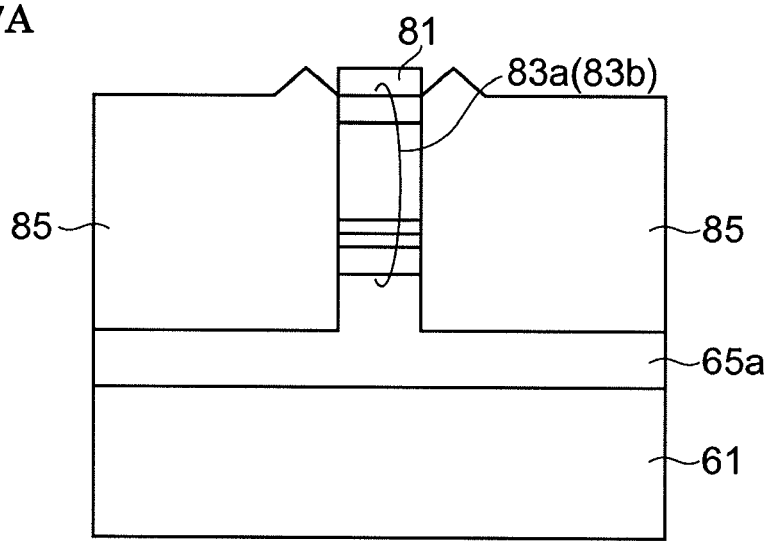
FIGS. 7A through 7C each are a process drawing showing a principal process in a method for manufacturing the integrated semiconductor optical device according to the embodiment, which follow FIG. 6B.
Figure 7B:
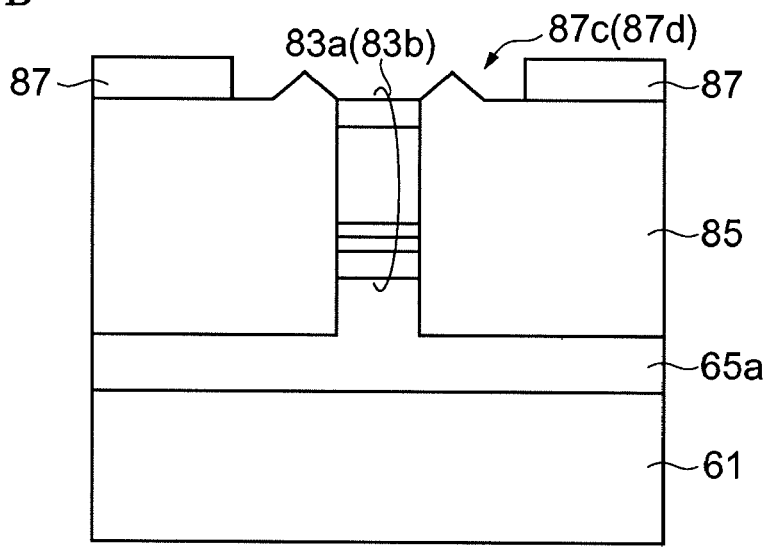
Figure 7C:
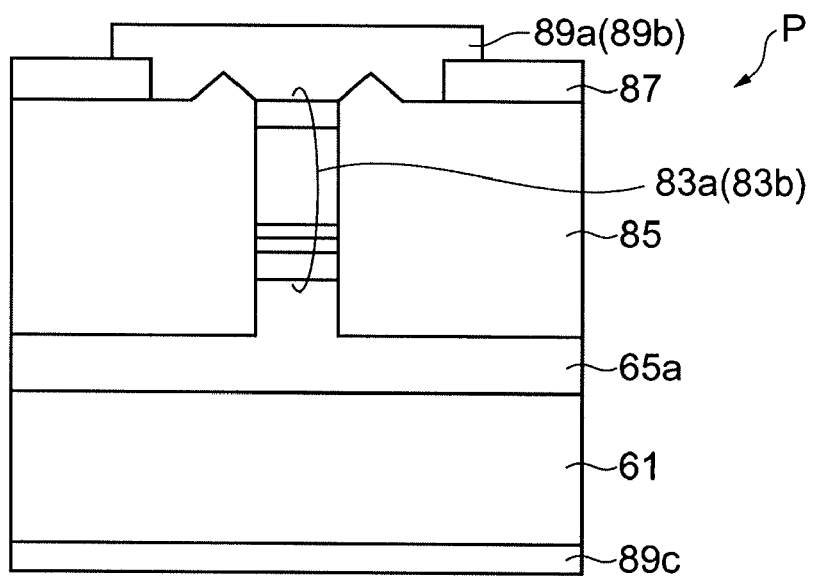

Then, as shown in FIG. 7A, Fe-doped InP layer is selectively grown and the semiconductor mesa 83 is buried by the MOVPE method using the mask 81. Since Fe dopant works as an electron trap, it has high resistivity against electron. After the mask 81 on the semiconductor mesa 83 is eliminated, as shown in FIG. 7B, a passivation film 87 is formed. The passivation film 87 is, for example, a silicon oxide ($SiO_2$) film or a silicon nitride (SiN) film.

The passivation film 87 on the top of the semiconductor laser portion and the optical modulator portion is provided with openings 87c and 87d, respectively. The contact layers 73d and 79d are exposed to the openings 87c and 87d, respectively. A first electrode 89a and a second electrode 89b are formed on the contact layers 73d and 79d in the semiconductor laser portion and the optical modulator portion, respectively. The first electrode 89a and the second electrode 89b are in contact with the contact layers 73d and 79d via the openings 87c and 87d, respectively. The first electrode 89a and the second electrode 89b are, for example, made of Ti/Pt/Au. A third electrode 89c is formed all over a secondary surface 61b of the substrate 61. The third electrode 89c is, for example, made of AuGe/Ni.

In the above-described processes, a substrate product P is manufactured for the integrated semiconductor optical device. By cleaving the substrate product P, discretely-separated integrated semiconductor optical devices are manufactured.

Although in this example the active layer is made of GaInAsP, multiple quantum-well structure including different compositions of GaInAsP/GaInAsP stack layer may be used. Alternatively, an active layer of quantum wire structure may be used. The semiconductor laser portion may be provided with diffraction grating for distributed feedback. In this case, the diffraction grating is provided on top of or at the bottom of the active layer.

As a semiconductor optical device to be combined for the integrated semiconductor optical device, not only a semiconductor laser but also an optical modulator is used. The integrated semiconductor optical device may also include three or more semiconductor optical devices.

Since a tunnel junction structure is provided on the active layer of the semiconductor light emitting device of the integrated semiconductor optical device, technical advantage of the present embodiment may be obtained. The tunnel junction region is composed of a heavily doped p-type semiconductor layer and a heavily doped n-type semiconductor layer. Dopant of carbon is preferably doped in the p-type semiconductor layer of the tunnel junction region. Carbon has smaller diffusion coefficient than that of zinc (Zn). Furthermore, carbon is not diffused with iron of the buried layer. The p-type semiconductor layer is made of AlGaInAs or AlAs which has larger band gap energy than that of GaInAsP. For a heavily doped n-type semiconductor layer, GaInAsP is used. The heavily doped n-type semiconductor layer made of GaInAsP has a band gap energy larger than that of active layer of the semiconductor light emitting device and smaller than that of InP. Absorption of light emitted from the semiconductor light emitting device due to the n-type semiconductor layer in the tunnel junction region is reduced. Any thickness of the p-type semiconductor layer and the n-type semiconductor layer in the tunnel junction region is preferably in the order of 10 nanometers. When at least any one of part of the Si-doped GaInAs contact layer of the semiconductor laser portion and part of the Zn-doped GaInAs contact layer of the optical modulator portion is eliminated at the joint between both devices to avoid the contact between both layers physically, electrical insulation between both devices of the integrated semiconductor optical device is enhanced.

In the semiconductor laser portion, the active layer is located between the n-type lower cladding layer and the n-type upper cladding layer. The Fe-doped InP layer covers the side surfaces of the active layer, the n-type lower cladding layer and the n-type upper cladding layer in the semiconductor mesa. Current is confined in the active layer in the semiconductor mesa. In addition, the tunnel junction is included in the semiconductor mesa. Therefore, area of the p-n junction in the tunnel junction region is reduced. One may fabricate the integrated semiconductor optical device with a ridge structure in place of the buried structure of the semiconductor mesa. However, a high performance with a low parasitic capacitance and a low leak current is obtained for the buried structure of the semiconductor mesa of the present embodiment comparing with the ridge structure. In the ridge structure, an active layer and a tunnel junction region are not etched. For the ridge structure, parasitic capacitance increases due to heavily doped tunnel junction region, and leak current increases, accordingly.

Figure 8:
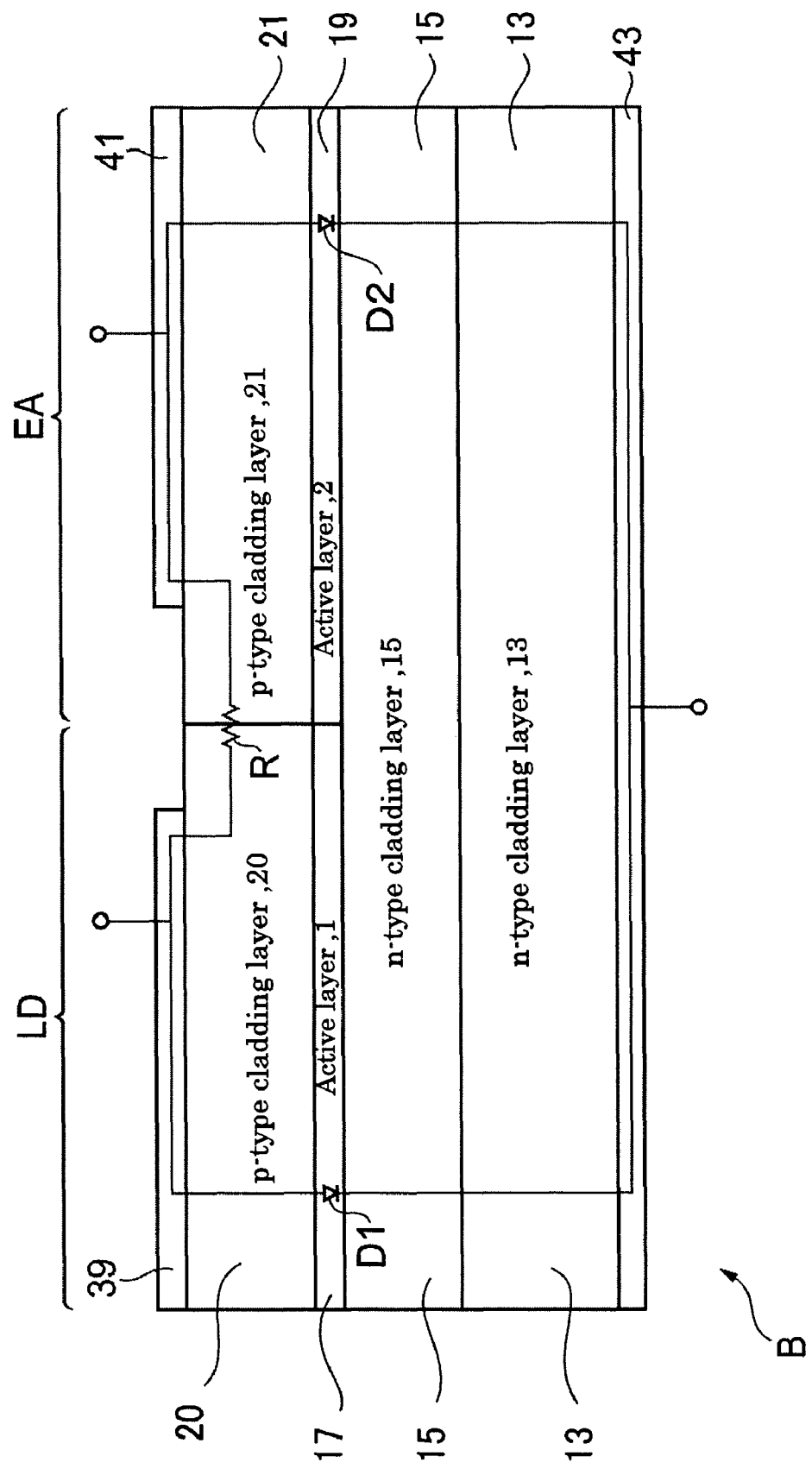
FIG. 8 is a circuit diagram showing an equivalent circuit B of a device structure which does not include a tunnel junction region.

The integrated semiconductor optical device requires reduction of an optical coupling loss between the semiconductor optical devices and improvement of electrical insulating performance. Especially, in the integration of a light emitting device (for example, LD) and an optical modulator device (for example, EA modulator), the light emitting device is forward biased and the optical modulator device is reverse biased. Therefore, potential difference between both devices is increased. So, the insulating performance between the devices needs to be further improved. FIG. 8 is a schematic view showing a device structure which does not include a tunnel junction region and also showing an equivalent circuit B of the device structure.

In FIG. 8, an active layer 1 of the semiconductor laser portion is formed between a p-type cladding layer 20 and an n-type cladding layer 15. An active layer 2 of the optical modulator portion is formed between a p-type cladding layer 21 and the n-type cladding layer 15. In the equivalent circuit B, the p-i-n junction diode D1 is composed of the p-type cladding layer 20, active layer 1 and n-type cladding layer 15. The p-i-n junction diode D2 is composed of the p-type cladding layer 21, active layer 2 and n-type cladding layer 15. When the equivalent circuit B is compared to the equivalent circuit A shown in FIG. 3, electrical insulating performance of the equivalent circuit B is insufficient. Therefore, when the modulation signal is applied to the optical modulator portion which is reverse biased, electric current flowing through the semiconductor laser portion is modulated by leak current. This parasitic modulation causes fluctuation of wavelength of laser oscillation. Consequently, optical transmission property is degraded.

In the equivalent circuit B, the optical modulator portion having D2 is reverse biased, and the semiconductor laser portion having D1 is forward biased. The electrical potential difference between the optical modulator portion and the semiconductor laser portion is generated. As a result, current flows from the optical modulator portion to the semiconductor laser portion through a resistance R between the devices according to the electrical potential difference when the modulation signal is applied to the optical modulator portion. This current flow from the optical modulator portion to the semiconductor laser portion causes variation of potential of the semiconductor laser portion. On the other hand, in the equivalent circuit A, the p-n junction diode (21, 27, 23) is connected in between the optical modulator portion and the semiconductor laser portion as shown in FIG. 3. In the integrated semiconductor optical device 11, the diode (21, 27, 23) is reverse biased when the semiconductor laser portion is forward biased and the optical modulator portion is reverse biased. Excellent insulating performance is obtained between the cladding layer of the optical modulator portion and the cladding layer of the semiconductor laser portion even when the electrical potential difference between the optical modulator portion and the semiconductor laser portion is generated.

Although in the preferred embodiment principle of the present invention is shown by a diagram and described, the aspect of the present invention is recognized by person skilled in the art that the aspect of the present invention may be modified in arrangement and detail without departing from such principle. The present invention is not limited to the specific structure disclosed in the embodiment. Therefore, claims and all of modifications and variations from range of sprit of the claims are claimed.

What is claimed is:

1. An integrated semiconductor optical device including a first semiconductor optical device and a second semiconductor optical device, comprising:
   a substrate having a principal surface having a first area and a second area, the first semiconductor device being provided on the first area, the second semiconductor device being provided on the second area, the first area and the second area being arranged along a direction of a predetermined axis extending along the principal surface of the substrate;
   a first cladding layer of a first conductivity type, first cladding area being provided on the principal surface of the substrate;
   a first active layer provided on the first cladding layer in the first area of the principal surface of the substrate;
   a second active layer provided on the first cladding layer in the second area of the principal surface of the substrate;
   a second cladding layer of a second conductivity type opposite to the first conductivity type, the second cladding layer being provided on the second active layer;
   a third cladding layer of a first conductivity type, the third cladding layer being provided on the first active layer; and
   a tunnel junction region provided between the first active layer and the third cladding layer in the first area of the principal surface of the substrate,
   wherein the first semiconductor device includes the first cladding layer, the first active layer, the tunnel junction region, and third cladding layer stacked in this order,
   the second semiconductor device includes the first cladding layer, the second active layer, and second cladding layer stacked in this order,
   the first active layer of the first semiconductor device is coupled to the second active layer of the second semiconductor device by butt joint,
   the second cladding layer of the second semiconductor device and the third cladding layer of the first semiconductor device form a p-n junction at the boundary between the second cladding layer and the third cladding layer, the boundary extending perpendicular to the direction of the predetermined axis,
   the tunnel junction region includes a first conductivity type semiconductor layer, a second conductivity type semiconductor layer and a tunnel junction that is located between the first conductivity type semiconductor layer and the second conductivity type semiconductor layer, and
   the third cladding layer is disposed on the first conductivity type semiconductor layer in the tunnel junction region.

2. The integrated semiconductor optical device according to claim 1, further comprising:
   a semiconductor mesa provided on the principal surface of the substrate and extending in the direction of the predetermined axis; and
   a buried layer provided on the principal surface of the substrate and a side surface of the semiconductor mesa,
   wherein the buried layer includes a semi-insulating semiconductor region, and
   the semiconductor mesa includes the first active layer of the first semiconductor device and the second active layer of the second semiconductor device.

3. The integrated semiconductor optical device according to claim 1, wherein the first semiconductor device including the first active layer is a semiconductor light emitting device, the second semiconductor device including the second active layer is a semiconductor optical modulation device, and
   band gap energy of the first active layer is smaller than that of the second active layer.

4. The integrated semiconductor optical device according to claim 1,
   wherein the first conductivity type is an n-type, and
   the second conductivity type is a p-type.

5. The integrated semiconductor optical device according to claim 1, wherein the second conductivity type semiconductor layer in the tunnel junction region includes a carbon-doped AlGaInAs layer.

6. The integrated semiconductor optical device according to claim 1, wherein the first conductivity type semiconductor layer in the tunnel junction region includes an n-type GaInAsP layer, wherein band gap energy of the GaInAsP layer is larger than that of the first active layer.

7. The integrated semiconductor optical device according to claim 1, wherein the second conductivity type semiconductor layer in the tunnel junction region is provided between the first conductivity type semiconductor layer in the tunnel junction region and the first active layer, and band gap energy of the second conductivity type semiconductor layer is larger than that of the first conductivity type semiconductor layer.

8. The integrated semiconductor optical device according to claim 1, further comprising:
   a first contact layer of a first conductivity type the first contact layer being provided on the third cladding layer;
   a second contact layer of a second conductivity type, second contact layer being provided on the second cladding layer; and
   a groove between the first contact layer and the second contact layer, the first contact layer being separated physically from the second contact layer by the groove.

9. The integrated semiconductor optical device according to claim 8, wherein the groove is provided on the p-n junction at the boundary between the second cladding layer and the third cladding layer, and the first contact layer and the second contact layer are not provided on the p-n junction.

10. An optical apparatus comprising:
an integrated semiconductor optical device including:
- a substrate having a principal surface having a first area for forming a first semiconductor optical device and a second area for forming a second semiconductor optical device;
- a first cladding layer provided on the principal surface of the substrate and made of a first conductivity type semiconductor;
- a first active layer provided on the first cladding layer in the first area of the principal surface of the substrate;
- a second active layer provided on the first cladding layer in the second area of the principal surface of the substrate;
- a second cladding layer provided on the second active layer and made of a second conductivity type semiconductor;
- a third cladding layer provided on the first active layer and made of a first conductivity type semiconductor; and
- a tunnel junction region provided between the first active layer and the third cladding layer, wherein the first active layer is coupled to the second active layer by butt joint, wherein the second cladding layer and the third cladding layer form a p-n junction at a boundary between the second cladding layer and the third cladding layer, and wherein the tunnel junction region includes a first conductivity type semiconductor layer, a second conductivity type semiconductor layer and a tunnel junction that is located between the first conductivity type semiconductor layer and the second conductivity type semiconductor layer;

a first power supply for applying forward bias to the integrated semiconductor optical device; and a second power supply for applying reverse bias to the integrated semiconductor optical device, wherein the integrated semiconductor optical device further includes a first electrode provided on the third cladding layer, a second electrode provided on the second cladding layer, and a third electrode provided on a secondary surface of the substrate, wherein the first power supply is connected in between the first electrode and the third electrode, and wherein the second power supply is connected in between the second electrode and the third electrode.

* * * * *